United States Patent
Won et al.

(10) Patent No.: US 7,813,188 B2
(45) Date of Patent: Oct. 12, 2010

(54) NON-VOLATILE MEMORY DEVICE AND A METHOD OF PROGRAMMING A MULTI LEVEL CELL IN THE SAME

(75) Inventors: Sam-Kyu Won, Hwaseong-si (KR); Jae-Won Cha, Seoul (KR); Kwang-Ho Baek, Hwaseong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 371 days.

(21) Appl. No.: 12/019,929

(22) Filed: Jan. 25, 2008

(65) Prior Publication Data

US 2009/0067254 A1    Mar. 12, 2009

(30) Foreign Application Priority Data

Sep. 10, 2007 (KR) ...................... 10-2007-0091543
Nov. 9, 2007 (KR) ...................... 10-2007-0114307

(51) Int. Cl.
*G11C 7/10* (2006.01)

(52) U.S. Cl. ............................ 365/189.05; 365/185.03; 365/185.22

(58) Field of Classification Search ............ 365/189.05, 365/185.03, 185.22
See application file for complete search history.

(56) References Cited

U.S. PATENT DOCUMENTS

| 6,903,981 B2 * | 6/2005 | Futatsuyama et al. .. 365/185.33 |
| 6,970,388 B2 * | 11/2005 | Takeuchi et al. ............ 365/200 |
| 7,173,862 B2 * | 2/2007 | Futatsuyama et al. .. 365/185.33 |
| 7,692,970 B2 * | 4/2010 | Park et al. .............. 365/185.22 |

FOREIGN PATENT DOCUMENTS

KR    1020060064856 A    6/2006

* cited by examiner

*Primary Examiner*—Tuan T. Nguyen
(74) *Attorney, Agent, or Firm*—Townsend and Townsend and Crew LLP

(57) ABSTRACT

A method of programming a multi level cell in a non-volatile memory device includes providing different data to main cells and indicator cells. The main cells and indicator cells have different threshold voltages in accordance with the data. A program operation is performed on a main cell and an indicator cell. A first verifying operation is performed based on a first verifying voltage of the main cell and the indicator cell. The program operation and the first verifying operation are performed repeatedly until a threshold voltage of a first cell of the indicator cells is higher than the first verifying voltage. A second verifying operation is performed on the main cell based on a second verifying voltage when the threshold voltage of the first cell is higher than the first verifying voltage.

16 Claims, 9 Drawing Sheets

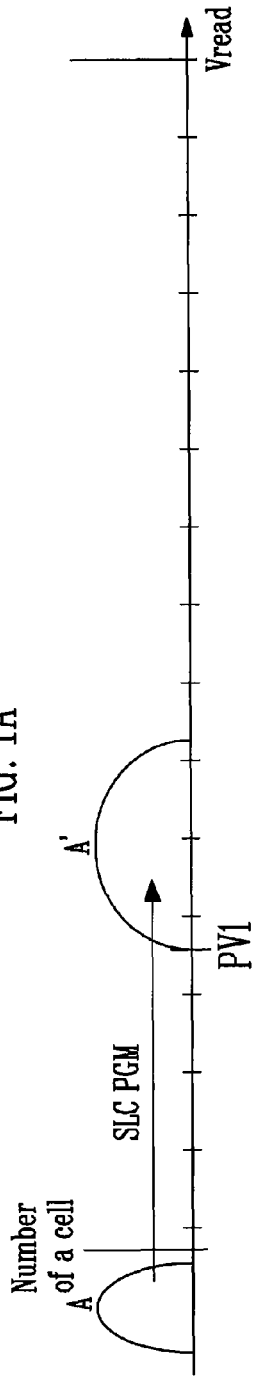
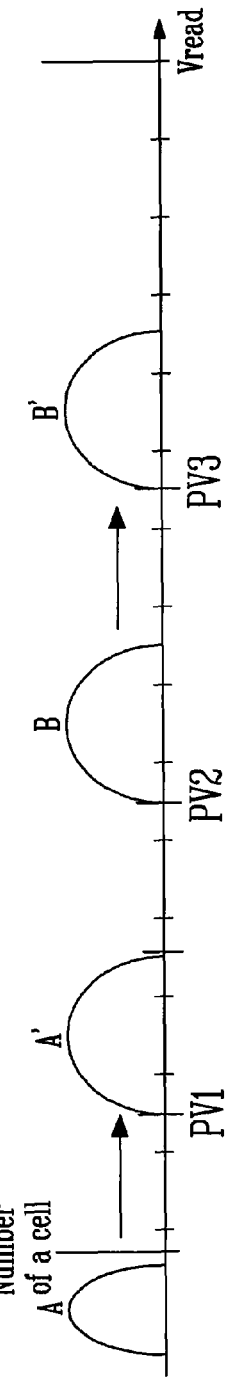
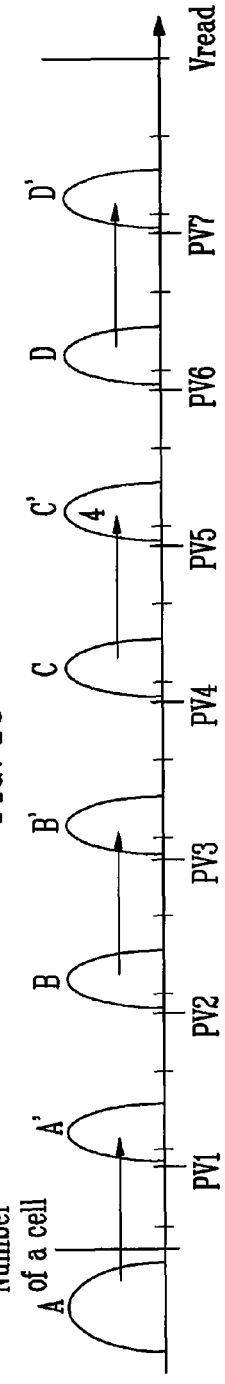

NON-VOLATILE MEMORY DEVICE AND A METHOD OF PROGRAMMING A MULTI LEVEL CELL IN THE SAME

CROSS-REFERENCE TO RELATED APPLICATIONS

This application claims priority from Korean Patent Application No. 2007-091543, filed on Sep. 10, 2007, and Korean Patent Application No. 2007-114307, filed on Nov. 9, 2007, the contents of which are incorporated herein by reference in its entirety.

BACKGROUND OF THE INVENTION

The present invention relates to a non-volatile memory device and a method of programming a multi level cell in the non-volatile memory device. More particularly, the present invention relates to a non-volatile memory device and a method of programming a multi level cell in the non-volatile memory device for programming efficiently a most significant bit of a specific memory cell.

Demand has increased for a non-volatile memory device which electrically programs and erases data, and does not require a refresh function of periodically rewriting data.

The non-volatile memory device includes a memory cell array having memory cells for storing data in a matrix, and a page buffer for programming data in a certain memory cell or reading data from a specific memory cell.

The page buffer has a pair of bit lines connected to the memory cells, a register for storing temporarily data to be programmed in the memory cell array or storing data read from the memory cell array, a sensing node for sensing voltage level of a specific bit line or a given register, and a bit line selecting circuit for controlling connection of the bit line and the sensing node.

A memory device for storing one or more bits has been developed to enhance integrity of the non-volatile memory device. This memory device is referred to as a multi level cell (MLC).

When programming the MLC for storing, for example, 2 bits, the MLC may store four data, e.g. 11, 10, 01 and 00. As a result, integrity of the non-volatile memory device may be increased.

A method of programming the MLC includes an operation of programming a corresponding memory cell by applying a program voltage to a word line of the memory cell and a verifying operation of verifying whether the program is performed. In the method of programming the MLC, unlike a method of programming a SLC, an operation of programming a least significant bit and an operation of programming a most significant bit are separately performed. When the most significant bit is programmed, at least two verifying operations are performed using verifying voltages having different magnitudes. Particularly, a first verifying operation is performed in accordance with a first verifying voltage, and a second verifying operation is performed in accordance with a second verifying voltage that is higher than the first verifying voltage irrespective of whether the first verifying operation is complete.

However, when the program voltage is applied in a unit of a page, the memory cell may not be programmed up to a voltage more than the second verifying voltage when the memory cell is not programmed to a voltage more than the first verifying voltage. As a result, efficiency of the method of programming the MLC may be lowered.

SUMMARY OF THE INVENTION

It is a feature of the present invention to provide a non-volatile memory device having an indicator cell.

It is another feature of the present invention to provide a method of programming an MLC in a non-volatile memory device for omitting a part of a verifying operation by using the indicator cell.

A method of programming a multi level cell in a non-volatile memory device according to one example embodiment includes providing different data to each of a plurality of cells comprising main cells and indicator cells, wherein the main cells and the indicator cells have different threshold voltages in accordance with the data; performing a program operation on a main cell and an indicator cell; performing a first verifying operation based on a first verifying voltage on the main cell and the indicator cell; performing repeatedly the program operation and the first verifying operation until a threshold voltage of a first cell of the indicator cells is higher than the first verifying voltage; and performing a second verifying operation on the main cell based on a second verifying voltage when the threshold voltage of the first cell is higher than the first verifying voltage.

A method of programming a multi level cell in a non-volatile memory device according to another example embodiment of the present invention includes providing different data to each of a plurality of cells comprising main cells and indicator cells, wherein the main cells and the indicator cells have different threshold voltages in accordance with the data; performing a program operation on a main cell and an indicator cell; performing a first verifying operation based on a first verifying voltage on the main cell and the indicator cell; performing repeatedly the program operation and the first verifying operation until a threshold voltage of a first cell of the indicator cells is higher than the first verifying voltage; performing a second verifying operation on the main cell based on a second verifying voltage when the threshold voltage of the first cell is higher than the first verifying voltage; performing repeatedly the program operation, the first verifying operation and the second verifying operation until a threshold voltage of a second cell of the indicator cells is higher than the second verifying voltage; performing a third verifying operation on the main cell based on a third verifying voltage when the threshold voltage of the second cell is higher than the second verifying voltage; performing repeatedly the program operation, the first verifying operation, the second verifying operation and the third verifying operation until a threshold voltage of a third cell of the indicator cells is higher than the third verifying voltage; and performing a fourth verifying operation on the main cell based on a fourth verifying voltage when the threshold voltage of the third cell is higher than the third verifying voltage.

A non-volatile memory device according to one example embodiment of the present invention includes a plurality of indicator cells that are verified based on whether a main cell is programmed; an indicator cell page buffer configured to output a verifying finish signal in accordance with a program result of an indicator cell; and a control logic circuit configured to change a verifying voltage by controlling a high voltage generator in accordance with the output verifying finish signal.

A time required for performing a verifying operation on a program of a multi level cell may be reduced in accordance with the above method and non-volatile memory device. A determination is made whether a subsequent verifying operation is performed in accordance with an increase of a threshold voltage of an indicator cell. This is advantageous over a conventional method of performing in sequence verifying operations based on a first verifying voltage to an nth verifying voltage. In addition, some of the verifying operations may be omitted.

BRIEF DESCRIPTION OF THE DRAWINGS

The above and other features and advantages of the present invention will become readily apparent by reference to the following detailed description when considered in conjunction with the accompanying drawings wherein:

FIG. 1A to FIG. 1D are views illustrating a threshold voltage distribution of a multi level cell in accordance with a program operation;

DESCRIPTION OF SPECIFIC EMBODIMENTS

Hereinafter, the preferred embodiments of the present invention will be explained in detail with reference to the accompanying drawings.

FIG. 1A to FIG. 1D are views illustrating a threshold voltage distribution of a multi level cell in accordance with a program operation.

FIG. 1A shows a threshold voltage distribution in accordance with a program operation of a least significant bit.

A memory cell is programmed in accordance with the program operation, and the programmed memory cell has a threshold voltage that is higher than a verifying voltage PV1.

FIG. 1B shows threshold voltage distributions when a multi level cell MLC having two bits is programmed.

The MLC has four threshold voltage distributions having different characteristics in accordance with programs of a least significant bit and a most significant bit. The threshold voltage distributions correspond to different verifying voltages. A verifying operation of the program of the least significant bit is performed based on a second verifying voltage PV2, and a verifying operation of the program of the most significant bit is performed based on a first verifying voltage PV1 or a third verifying voltage PV3.

FIG. 1C shows threshold voltage distributions when an MLC for storing three bits is programmed.

The MLC has eight threshold voltage distributions having different characteristics in accordance with programs of a least significant bit, a first most significant bit and a second most significant bit. The threshold voltage distributions correspond to different verifying voltages. A verifying operation of the program of the least significant bit is performed based on a fourth verifying voltage PV4, a verifying operation of the program of the first most significant bit is performed based on a second verifying voltage PV2 or a sixth verifying voltage PV6, and a verifying operation of the program of the second most significant bit is performed based on a first verifying voltage PV1, a third verifying voltage PV3, a fifth verifying voltage PV5 or a seventh verifying voltage PV7.

Figure 1D:
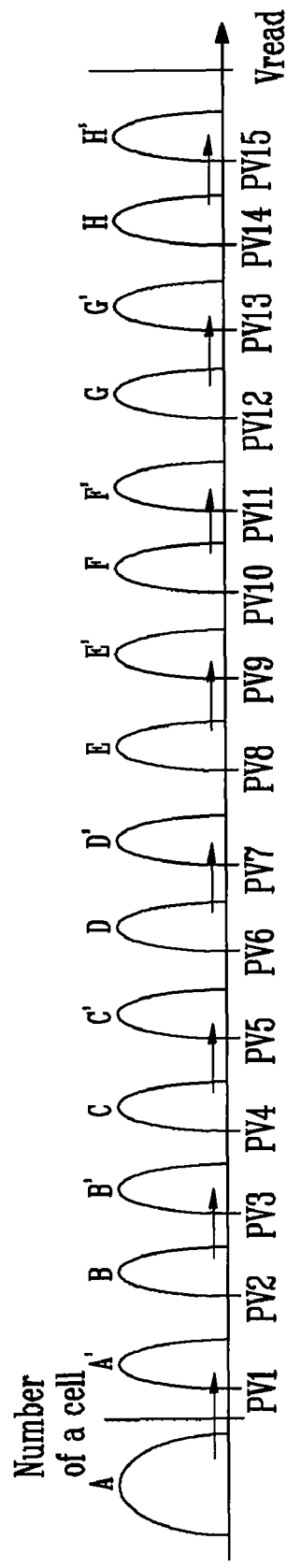

FIG. 1D shows threshold voltage distributions when an MLC for storing four bits is programmed.

The MLC has sixteen threshold voltage distributions having different characteristics in accordance with programs of a least significant bit, a first most significant bit, a second most significant bit and a third most significant bit. The threshold voltage distributions correspond to different verifying voltages. A verifying operation of the program of the least significant bit is performed based on an eighth verifying voltage PV8, and a verifying operation of the program of the first most significant bit is performed based on a fourth verifying voltage PV4 or a twelfth verifying voltage PV12. In addition, a verifying operation of the program of the second most significant bit is performed based on a second verifying voltage PV2, a sixth verifying voltage PV6, a tenth verifying voltage PV10 or a fourteenth verifying voltage PV14, and a verifying operation of the program of the third most significant bit is performed based on a first verifying voltage PV1, a third verifying voltage PV3, a fifth verifying voltage PV5, a seventh verifying voltage PV7, a ninth verifying voltage PV9, an eleventh verifying voltage PV11, a thirteenth verifying voltage PV13 or a fifteenth verifying voltage PV15.

Figure 2A:
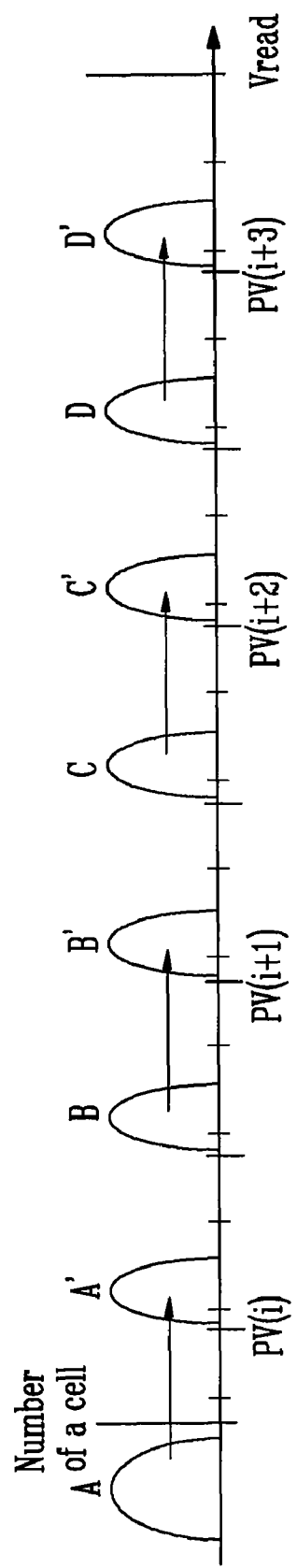
FIG. 2A is a view illustrating threshold voltage distributions when an MLC having three bits is programmed.
Figure 2B:
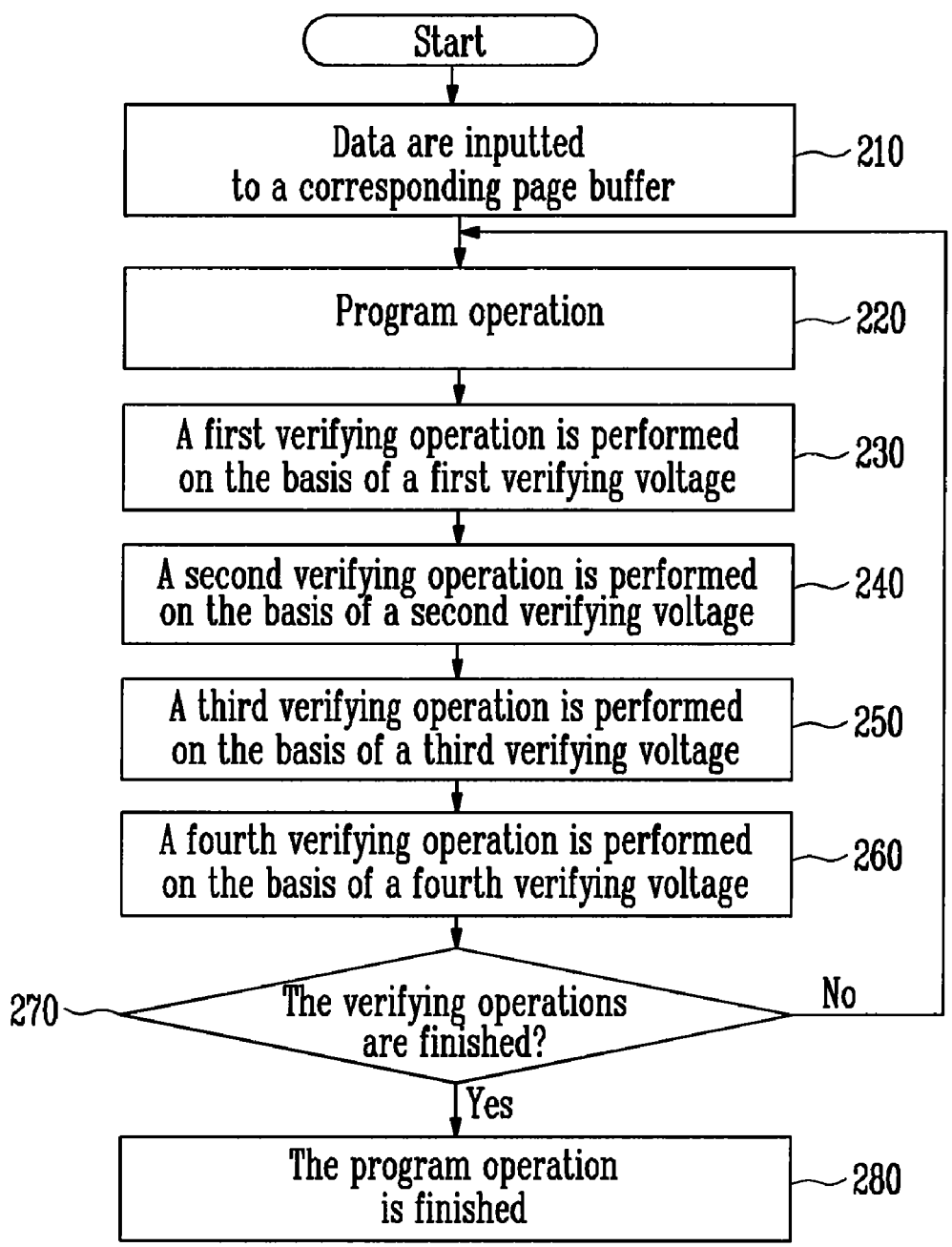
FIG. 2B is a flow chart illustrating a common verifying operation for verifying the program of the MLC having three bits.
Figure 2C:
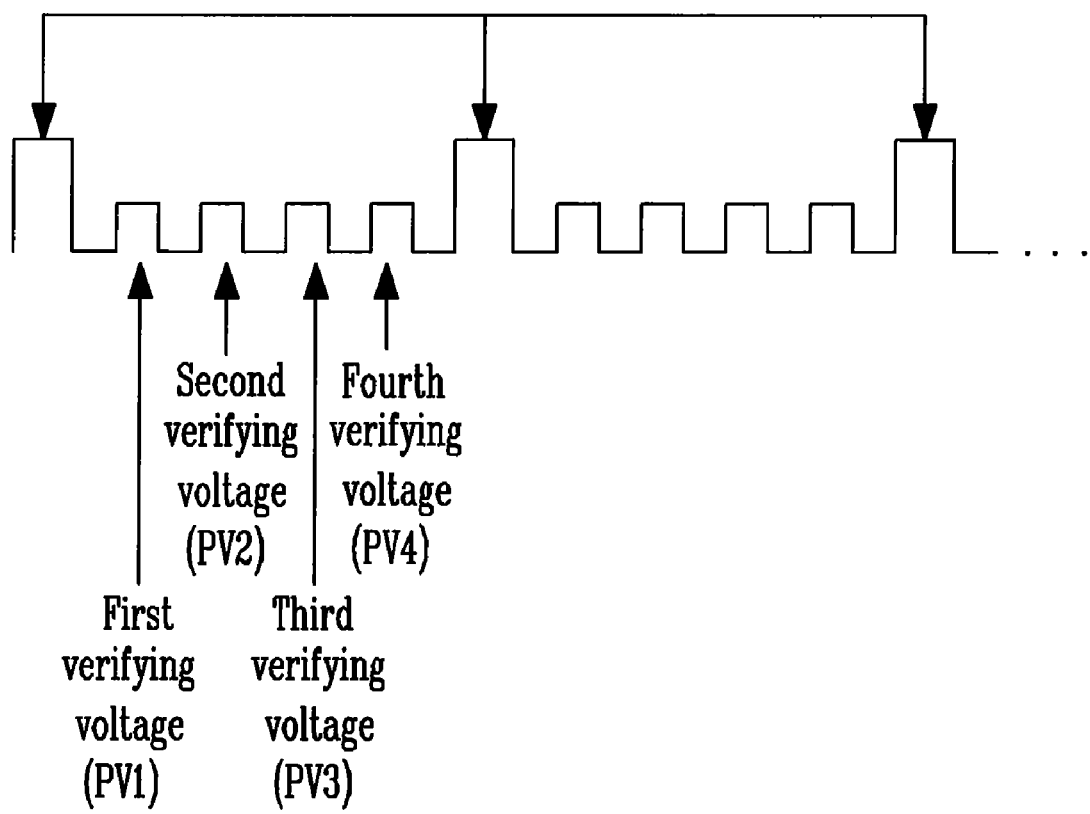
FIG. 2C is a view illustrating a waveform of a program voltage and a verifying voltage applied in the common program operation for programming the MLC having three bits.

FIG. 2A is a view illustrating threshold voltage distributions when an MLC having three bits is programmed. FIG. 2B is a flow chart illustrating a common verifying operation for verifying the program of the MLC having three bits. FIG. 2C is a view illustrating a waveform of a program voltage and a verifying voltage applied in the common program operation for programming the MLC having three bits.

In step 210, data to be programmed are input to a page buffer connected to a specific memory cell to be programmed.

Each of memory cells in a memory cell array is connected to the page buffer through a corresponding bit line. The data to be programmed to the memory cell are input and stored in a register of the page buffer.

In step 220, the data input to the page buffer are transmitted to the bit line, and a program operation is performed.

The data stored in the page buffer are provided to the bit line, and a voltage level of the bit line has a high level or a low level in accordance with the provided data.

A program voltage is applied to a word line connected vertically to the bit line. The program voltage is applied to the word line connected to the memory cell to be programmed, and a pass voltage smaller than the program voltage is applied to the word lines except the word line connected to the memory cell to be programmed. Accordingly, when the program voltage is applied to the word line when the bit line has a low level, the memory cell is programmed, and each memory cell except the programmed memory cell maintains its state as an erase state.

The program voltage is repeatedly applied to a corresponding memory cell and each application is increased by a given level in accordance with an incremental step pulse programming ISPP method. In this case, the program operation is continuously performed in accordance with the ISPP method until a threshold voltage of the programmed memory cell is increased more than a given voltage. The program operation is stopped when the threshold voltage of the programmed memory cell is greater than the given voltage. An operation of verifying whether the threshold voltage of the programmed memory cell is increased more than the given voltage is referred to as a verifying operation.

Hereinafter, the verifying operation will be described in detail.

In step 230, a first verifying operation is performed in accordance with a first verifying voltage PV(i). The first verifying voltage PV(i) is applied to the word line when the bit line connected to the memory cell to be verified is precharged to a high level, and the pass voltage is provided to the word lines except the word line to which the first verifying voltage PV(i) is applied.

When the memory cell is programmed, i.e. a threshold voltage of the memory cell is higher than the first verifying voltage PV(i), the memory cell is not turned on. Hence, a current path is not formed in a cell string having the memory cell, and the voltage level of the bit line is maintained at a high level.

However, when the memory cell is not programmed, i.e. the threshold voltage of the memory cell is smaller than the first verifying voltage PV(i), the memory cell is turned on. As a result, a current path is formed in the cell string, and the voltage level of the bit line is converted from a high level into a low level. Since the voltage level of the bit line is changed depending on the above program result, the voltage of the bit line is provided to a sensing node and stored in the register of the page buffer.

In step 240, a second verifying operation is performed based on a second verifying voltage PV(i+1). The second verifying operation is similar to the first verifying operation. However, the second verifying operation is different from the first verifying operation in that the second verifying voltage PV(i+1) is applied to the word line to be verified.

In step 250, a third verifying operation is performed based on a third verifying voltage PV(i+2). The third verifying operation is similar to the first verifying operation. However, the third verifying operation is different from the first verifying operation in that the third verifying voltage PV(i+2) is applied to the word line to be verified.

In step 260, a fourth verifying operation is performed based on a fourth verifying voltage PV(i+3). The fourth verifying operation is similar to the first verifying operation. However, the fourth verifying operation is different from the first verifying operation in that the fourth verifying voltage PV(i+3) is applied to the word line lo to be verified.

The verifying operations are performed in sequence by applying the first verifying voltage PV(i) to the fourth verifying voltage PV(i+3) after one program pulse is provided.

However, when a memory cell is to be programmed to a voltage more than the first verifying voltage PV(i), it is difficult to program the memory cell to a voltage more than the second verifying voltage PV(i+1) to the fourth verifying voltage PV(i+3) when the memory cell is not programmed to a voltage more than the first verifying voltage PV(i). Hence, when performing the second verifying operation to the fourth verifying operation when the first verifying operation is not finished, efficiency of the verifying operation is lowered.

This problem is shown in FIG. 2C.

As shown in FIG. 2C, fourth verifying voltages having different magnitudes are applied to verify whether the program operation is finished after the program voltage is provided to the word line.

The first verifying operation to the fourth verifying operation are performed in sequence irrespective of whether the first verifying operation is completed after one program operation is performed.

Figure 3:
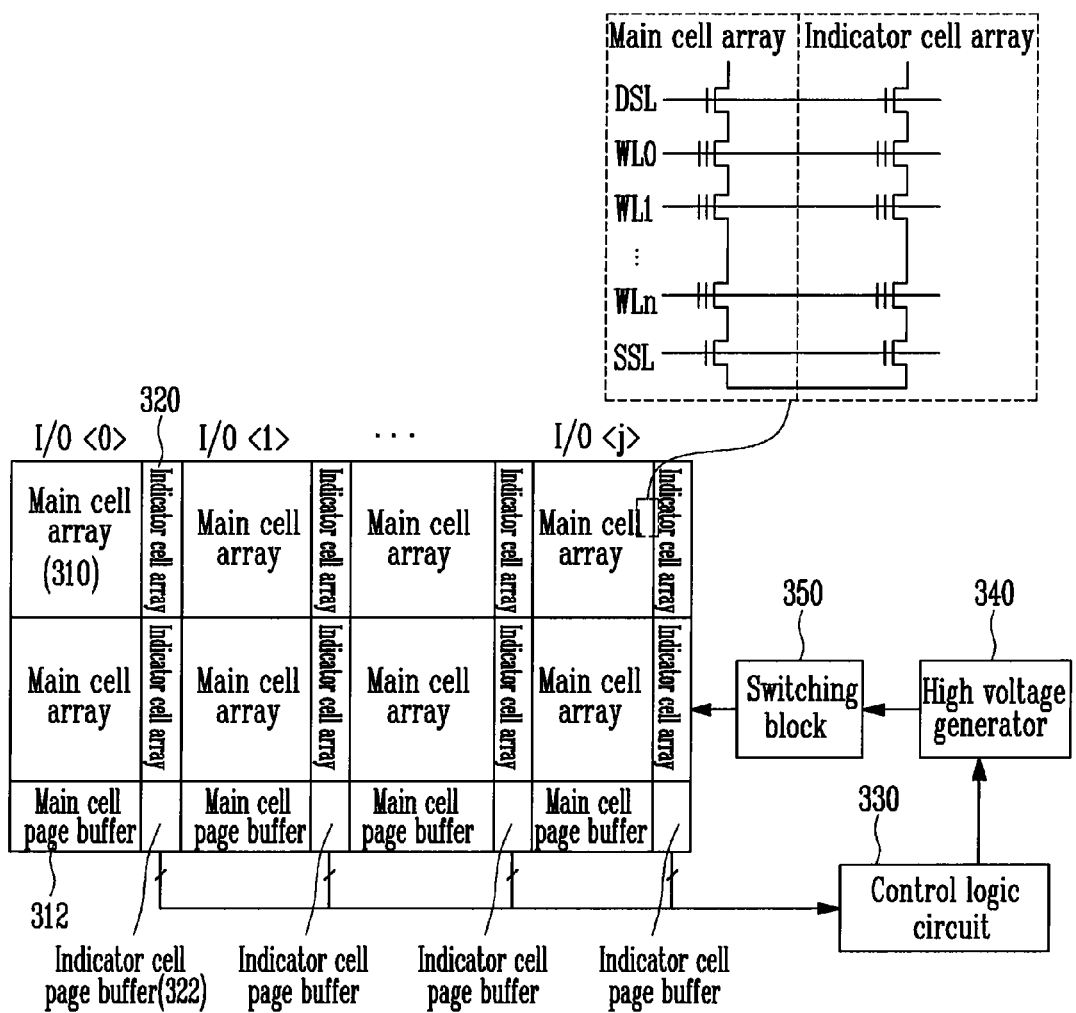
FIG. 3 is a view illustrating a non-volatile memory device according to one example embodiment of the present invention.

FIG. 3 is a view illustrating a non-volatile memory device according to one example embodiment of the present invention.

The non-volatile memory device of the present embodiment includes a main cell array 310 for storing data input from an outside device through a program operation, a main cell page buffer 312 for storing temporarily data to be stored in the main cell array 310 or storing temporarily data read from the main cell array 310, an indicator cell array 320 for a verifying operation, and an indicator cell page buffer 322 for storing temporarily data to be stored in the indicator cell array 320 or storing temporarily data read from the indicator cell array 320.

In addition, the non-volatile memory device further includes a control logic circuit 330 for controlling operation of a high voltage generator 340 in accordance with a verifying finish signal output from the indicator cell page buffer 322, the high voltage generator 340 for outputting a program voltage, verifying voltages, a read voltage or an erase voltage, etc. in accordance with control of the control logic circuit 330, and a switching block 350 for applying selectively the output high voltages to corresponding word lines related to the memory cell.

The main cell array 310 has memory cells for storing data, word lines WL0 to WLn for activating selectively the memory cells and bit lines BL0 to BLm for inputting/outputting data to/from the memory cells. The word lines WL0 to WLn and the bit lines BL0 to BLm are arranged in a matrix.

The main cell array 310 has also a plurality of cell strings in which the memory cells are coupled in series, drain select transistors coupled to a drain select line DSL for coupling selectively a specific memory cell to a corresponding bit line, and source select transistors coupled to a source select line SSL for coupling selectively a given memory cell to a common source line.

Gates of the memory cells are coupled to the word lines WL0 to WLn. A group having the memory cells coupled in common to one word line is referred to as a page. Additionally, the cell strings coupled to each of the bit lines are coupled in parallel to the common source line. A group having these cell strings is referred to as a block.

Hereinafter, the main cell page buffer 312 will be described in detail with reference to the accompanying drawings.

Figure 4:
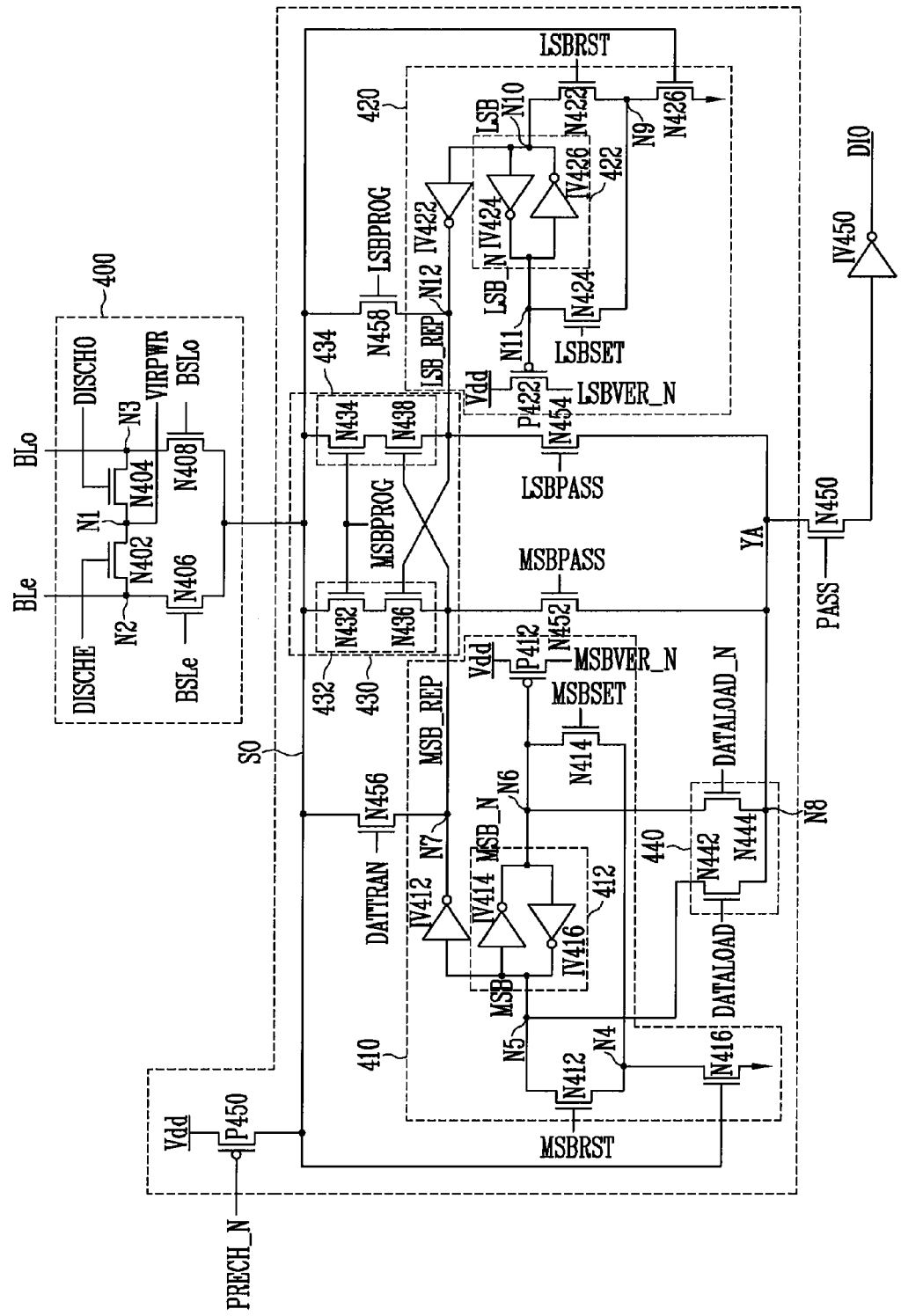
FIG. 4 is a view illustrating a page buffer in a non-volatile memory device according to one example embodiment of the present invention.

FIG. 4 is a view illustrating a page buffer in a non-volatile memory device according to one example embodiment of the present invention.

The non-volatile memory device includes a memory cell array for storing data and a page buffer.

The page buffer has a bit line selecting circuit 400 for coupling selectively a bit line BLe or BLo to a sensing node SO, a first register 410 and a second register 420 for storing specific data, a data comparing circuit 430 for comparing data in the first register 410 with data in the second register 420 and transmitting the comparison result to the sensing node SO, and a data inputting circuit 440.

The bit line selecting circuit 400 includes an N-MOS transistor N406 for coupling the even bit line BLe to the sensing node SO in response to an even bit line selecting signal BSLe, and an N-MOS transistor N408 for coupling the odd bit line BLo to the sensing node SO in response to an odd bit line selecting signal BSLo. Accordingly, the bit line BLe or BLo is coupled to the sensing node SO in accordance with a voltage level of the bit line selecting signal BSLe or BSLo.

The bit line selecting circuit 400 also has a control signal inputting terminal for providing a control signal VIRPWR having a specific level, an N-MOS transistor N402 for coupling the even bit line BLe to the control signal inputting terminal in response to an even discharge signal DISCHe, and an N-MOS transistor N404 for coupling the odd bit line BLo to the control signal inputting terminal in response to an odd discharge signal DISCHo. Accordingly, the bit line BLe or BLo is precharged to a high level or is discharged to a low level in accordance with a voltage level of the control signal VIRPWR.

The first register 410 includes a latch 412 having two inverters IV414 and IV416, an N-MOS transistor N412 coupled to a first node MSB of the latch 412, an N-MOS transistor N414 coupled to a second node MSB_N of the latch 412, an inverter IV412, a P-MOS transistor P412 for outputting a voltage Vdd having a high level to a terminal corresponding to an MSB verifying signal MSBVER_N and being turned on in accordance with a voltage level of the second node MSB_N, and an N-MOS transistor N416 coupled between a node N4 and a ground, wherein the node N4 is located between the N-MOS transistor N412 and the N-MOS transistor N414.

The N-MOS transistor N412 is coupled between the first node MSB and the node N4, and is turned on in response to an MSB reset signal MSBRST.

The N-MOS transistor N414 is coupled between the second node MSB_N and the node N4, and is turned on in response to an MSB set signal MSBSET.

The N-MOS transistor N416 is coupled between the node N4 and the ground, and is turned on in response to the voltage level of the sensing node SO, thereby supplying a ground voltage to the node N4.

The second register 420 includes a latch 422 having two inverters IV424 and IV426, an N-MOS transistor N422 coupled to a first node LSB of the latch 422, an N-MOS transistor N424 coupled to a second node LSB_N of the latch 422, an inverter IV422, a P-MOS transistor P422 for outputting a voltage Vdd having a high level to a terminal corresponding to a verifying signal LSBVER_N and being turned on in accordance with a voltage level of the second node LSB_N, and an N-MOS transistor N426 coupled between a node N9 and the ground, wherein the node N9 is located between the N-MOS transistor N422 and the N-MOS transistor N424.

The N-MOS transistor N422 is coupled between the first node LSB and the node N9, and is turned on in response to an LSB reset signal LSBRST.

The N-MOS transistor N424 is coupled between the second node LSB_N and the node N9, and is turned on in response to an LSB set signal LSBSET.

The N-MOS transistor N426 is coupled between the node N9 and the ground, and is turned on in accordance with the voltage level of the sensing node SO, thereby supplying the ground voltage to the node N9.

The data comparing circuit 430 transmits data corresponding to logical product of the data in the first register 410 and the data in the second register 420 to the sensing node SO in response to an MSB program signal MSBPROG.

The data comparing circuit 430 includes a first comparing circuit 432 and a second comparing circuit 434.

The first comparing circuit 432 has an N-MOS transistor N432 and an N-MOS transistor N436.

The N-MOS transistors N432 and N436 are coupled in series between the sensing node SO and a node N7.

The N-MOS transistor N432 is turned on in accordance with the MSB program signal MSBPROG.

The N-MOS transistor N436 is turned on in response to a voltage of a node N12, and couples the sensing node SO to the node N7 or disconnects the sensing node SO from the node N7.

The second comparing circuit 434 includes an N-MOS transistor N434 and an N-MOS transistor N438.

The N-MOS transistors N434 and N438 are coupled in series between the sensing node SO and the node N12.

The N-MOS transistor N434 is turned on in response to the MSB program signal MSBPROG.

The N-MOS transistor N438 is turned on in accordance with a voltage of the node N7, and couples the sensing node SO to the node N12 or disconnects the sensing node SO from the node N12.

The sensing node SO is precharged to a high level by turning on a transistor P450 during a preset time when the data comparing circuit 430 is operated. The MSB program signal MSBPROG having a high level is provided when the sensing node SO is precharged. The voltage level of the sensing node SO is changed depending on the voltage level of the node N7 and the voltage level of the node N12 as shown in the following table.

| Operation of the data comparing circuit 430 | Voltage of the node N7 | Voltage of the node N12 | Voltage of the sensing node SO |
|---|---|---|---|
| Transistors N436 and N438 are turned on | High | High | High |
| Transistor N438 is turned on | High | Low | Low |
| Transistor N436 is turned on | Low | High | Low |
| Transistors N436 and N438 are turned off | Low | Low | A voltage by the precharging is maintained. |

As shown in the table, turn on/off of the N-MOS transistors N436 and N438 is determined in accordance with the voltage levels of the nodes N7 and N12. In addition, it is determined whether or not the voltages of the nodes N7 and N12 affect the sensing node SO in accordance with the turn on/off of the N-MOS transistors N436 and N438.

When the nodes N7 and N12 have a low level, the transistors N436 and N438 are turned off, and the transmission of the data corresponding to the logical product is stopped. In this case, the voltage of the sensing node SO is determined in accordance with the voltage level by the precharging.

The data inputting circuit 440 has an N-MOS transistor N442 and an N-MOS transistor N444.

The N-MOS transistor N442 is coupled between the first node MSB and an input/output terminal YA, and is turned on in response to a data inputting signal DATALOAD. When the N-MOS transistor N442 is turned on, data of the input/output terminal YA are transmitted to the first node MSB in the first register 410.

The N-MOS transistor N444 is coupled between the second node MSB_N and the input/output terminal YA, and is turned on in response to an inverse data inputting signal DATALOAD_N. When the N-MOS transistor N444 is turned on, the data of the input/output terminal YA are transmitted to the second node MSB_N. Accordingly, when the data inputting signal DATALOAD has a high level when the input/output terminal YA is coupled to the ground, the N-MOS transistor N442 is turned on, and the first node MSB has a low level. However, when the inverse data inputting signal DATALOAD_N has a high level, the N-MOS transistor N444 is turned on, and the second node MSB_N has a low level. As a result, the data of the input/output terminal YA are provided to the second node MSB_N.

An N-MOS transistor N456 for transmission of data is coupled between the node N7 and the sensing node SO, and is turned on in response to a data transmitting signal DATTRAN. Accordingly, the data of the node N7 are transmitted to the sensing node SO when the N-MOS transistor N456 is turned on.

An N-MOS transistor N458 for transmission of data is coupled between the node N12 and the sensing node SO, and is turned on in response to a LSB program signal LSBPROG. Accordingly, the data of the node N12 are transmitted to the sensing node SO when the N-MOS transistor N458 is turned on.

The P-MOS transistor P450 coupled between a power supply voltage Vdd and the sensing node SO is turned on in response to a precharge signal PRECH_N having a low level. When the P-MOS transistor P450 is turned on, the power supply voltage Vdd is applied to the sensing node SO. As a result, the sensing node SO is precharged to the level of the power supply voltage Vdd.

The page buffer further includes transistors N450, N452 and N454 for transmitting the data provided to the nodes N7 and N12 to an outside terminal.

The MSB pass device N452 is embodied as an N-MOS transistor, is coupled between the node N7 and a node N8, and operates in response to an MSB pass signal MSBPASS.

The LSB pass device N454 is embodied as an N-MOS transistor, is coupled between the node N12 and the node N8, and operates in response to an LSB pass signal LSBPASS.

The data pass device N450 is embodied as an N-MOS transistor, and applies a voltage provided to the node N8 to an inverter IV450 in response to a pass signal PASS.

The above page buffer is an example embodiment of the present invention. Another page buffer may be used. For example, a page buffer having three latches may be used to operate efficiently an MLC for storing 3 bits.

Hereinafter, the indicator cell array 320 will be described in detail.

The indicator cell is a characteristic element of the present invention, and is verified instead of the main cell when a program of the main cell is verified. In addition, the indicator cell is used for determining based on a specific verifying voltage whether a verifying operation is performed. When the verifying operation of the indicator cell based on the specific verifying voltage is finished, a verifying operation is performed again based on a voltage that is higher than the specific verifying voltage. Accordingly, the indicator cell includes a memory cell having the same characteristic as the memory cell in the main cell. In addition, an indicator cell block has the same structure as a main cell block.

The non-volatile memory device has cell strings in which indicator cells are coupled in series as shown by the dotted line in FIG. 3, drain select transistors coupled to the drain select line DSL for coupling selectively a specific indicator cell to the bit line, and source select transistors coupled to the source select line SSL for coupling selectively a specific memory cell to the common source line.

Hereinafter, the indicator cell page buffer 322 will be described in detail.

The indicator cell page buffer 322 stores temporarily data to be stored in the indicator cell or stores temporarily data read from the indicator cell. Hence, the structure of the indicator cell page buffer 322 may be similar to that of the main cell page buffer 312 described above.

The indicator cell page buffer 322 performs a verifying operation based on a specific verifying voltage, and transmits a verifying finish signal to the control logic circuit 330 when the verifying operation is finished.

Hereinafter, the verifying finish signal will be described in detail with reference to FIG. 4.

Data '0' or '1' is stored in the second node MSB_N of the first register 410 in accordance with data input from an outside device. When data '0' is stored in the second node MSB_N, it is assumed that a corresponding cell is programmed. Whereas, when data '1' is stored in the second node MSB_N, it is assumed that a corresponding cell is erased.

The data stored in the second node MSB_N are transmitted to the bit line through the sensing node SO. As a result, voltage of the bit line has a low level or a high level in accordance with the transmitted data. Then, a program operation is performed in accordance with the voltage of the bit line.

The voltage level of the bit line is changed depending on the program result when a verifying operation is performed. Particularly, when a specific memory cell is programmed to a voltage more than a verifying voltage, the voltage of the bit line is maintained at a high level. When the memory cell is not programmed to a voltage more than the verifying voltage, the voltage of the bit line has a low level.

The voltage of the bit line is applied to the sensing node SO. The N-MOS transistor N416 in the first register 410 is turned on/off in accordance with the voltage applied to the sensing node SO.

When a given memory cell is programmed to a voltage more than the verifying voltage, a voltage having a high level is applied to the sensing node SO, and the N-MOS transistor N416 in the first register 410 is turned on. However, when the memory cell is not programmed to a voltage more than the verifying voltage, a voltage having a low level is applied to the sensing node SO, and the N-MOS transistor N416 in the first register 410 is turned off.

The MSB reset signal MSBRST having a high level is transmitted to the N-MOS transistor N412 in the first register 410 while the verifying operation is performed. Accordingly, the N-MOS transistors N412 and N416 are turned on when the memory cell is programmed to a voltage more than the verifying voltage, and data having a high level, i.e. data '1', is stored in the second node MSB_N.

When the memory cell is a program objection cell and data '0' is stored in the second node MSB_N, the sensing node SO has a low level when the memory cell is not programmed to a voltage more than the verifying voltage. Accordingly, the N-MOS transistor N416 is not turned on, and data '0' is maintained.

When the memory cell is an erase objection cell and data '1' is stored in the second node MSB_N, the sensing node SO has a low level because the memory cell is not programmed. Accordingly, the N-MOS transistor N416 is not turned on, and data '1' is maintained.

In brief, data '0' is stored in the second node MSB_N only when the memory cell is not programmed to a voltage more than the verifying voltage of a program objection cell.

When every program objection cell is programmed to a voltage more than the verifying voltage by transmitting repeatedly a program pulse, data '1' is stored in the second node MSB_N in each of the page buffers. Data '1' is transmitted to a gate of the P-MOS transistor P412, and the P-MOS transistor is turned off. As a result, the MSB verifying signal MSBVER_N has a floating state, and the MSB verifying signal MSBVER_N is transmitted to the control logic circuit 330.

A verifying operation in the second register 420 may be similar to the above verifying operation. In addition, a process of outputting the LSB verifying signal LSBVER_N in the second register 420 is similar to that of outputting the MSB verifying signal MSBVER_N.

Hereinafter, a verifying operation according to one example embodiment of the present invention will be described in detail with reference to the accompanying drawings.

Figure 5:
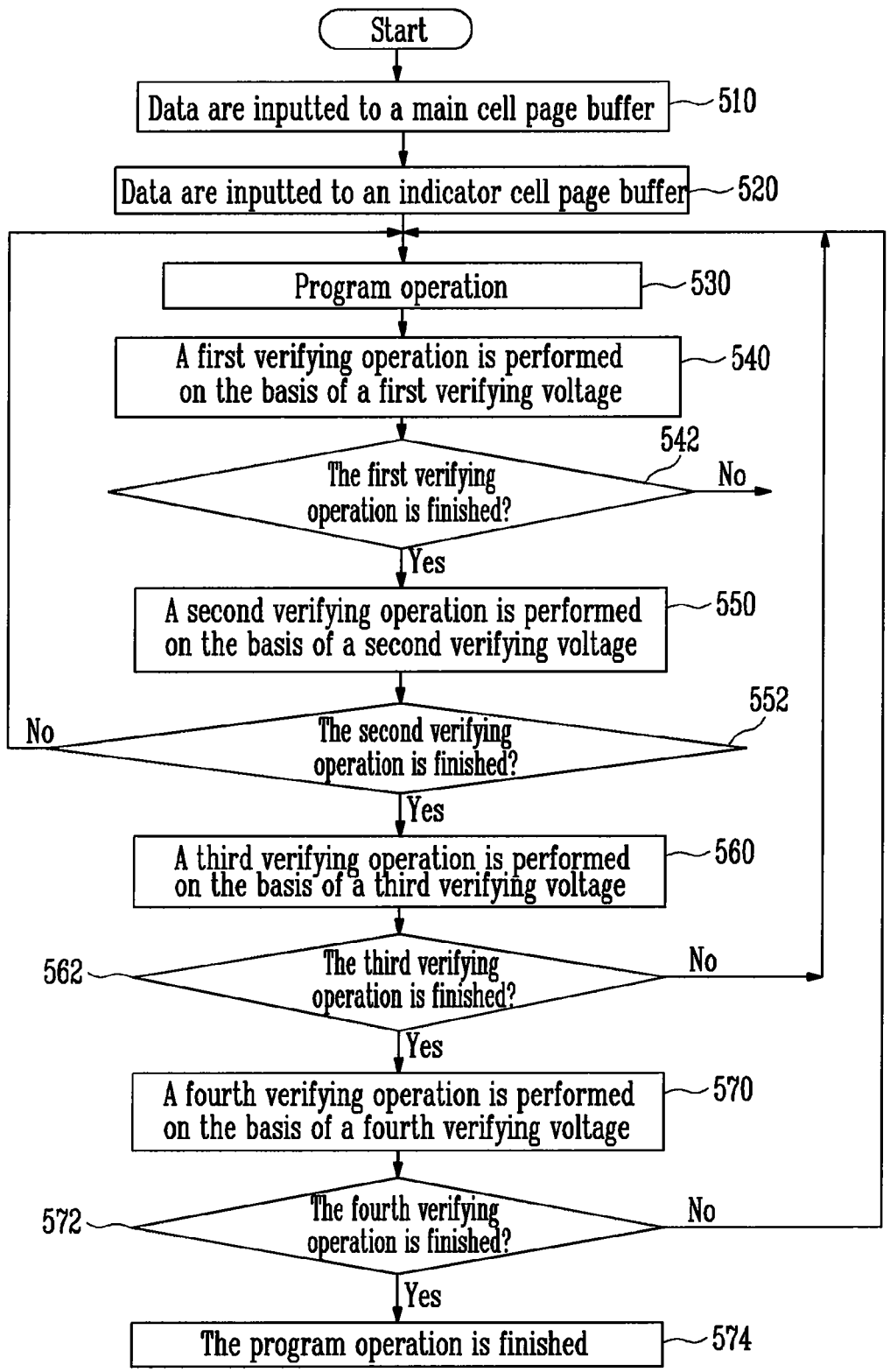
FIG. 5 is a flow chart illustrating a process of verifying a program of an MLC according to one example embodiment of the present invention.
Figure 6:
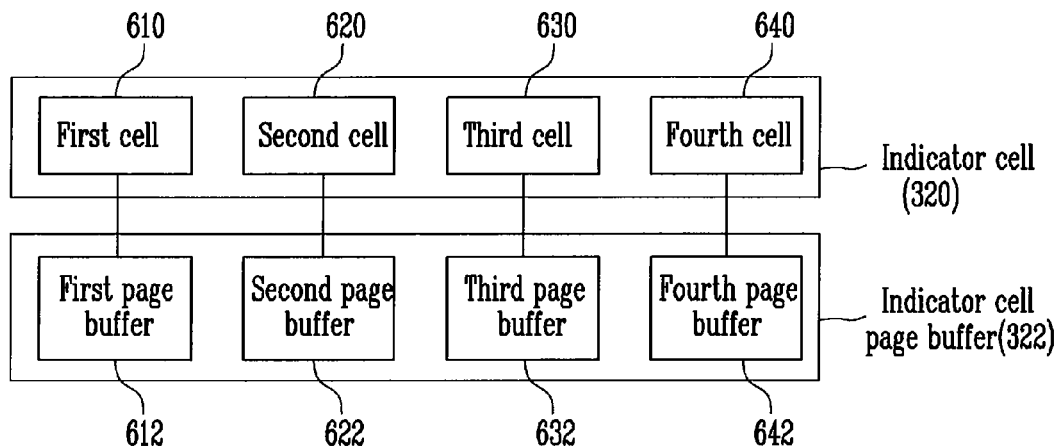
FIG. 6 is a view illustrating an indicator cell and an indicator cell page buffer according to one example embodiment of the present invention.

FIG. 5 is a flow chart illustrating a process of verifying a program of an MLC according to one example embodiment of the present invention. FIG. 6 is a view illustrating an indicator cell and an indicator cell page buffer according to one example embodiment of the present invention.

In step 510, data to be programmed to the main cell array 310 are input to the main cell page buffer 312 before a program operation is performed. Memory cells are coupled to a corresponding page buffer through the bit line, and the data to be programmed to a specific memory cell are input to each of the registers in the page buffer and stored in each of the registers.

In step 520, data to be programmed to the indicator cell array 320 are input to the indicator cell page buffer 322.

Referring to FIG. 6, the indicator cell array 320 includes a first cell 610 on which a first verifying operation is performed based on the first verifying voltage PV(i), a second cell 620 on which a second verifying operation is performed based on the second verifying voltage PV(i+1), a third cell 630 on which a third verifying operation is performed based on the third verifying voltage PV(i+2), and a fourth cell 640 on which a fourth verifying operation is performed based on the fourth verifying voltage PV(i+3). Each of the cells 610, 620, 630 and 640 may have a plurality of memory cells. That is, the verifying operation is performed on the memory cells. When one of the memory cells is programmed to a voltage that is more than the corresponding verifying voltage, a verifying operation may be performed again based on a subsequent verifying voltage.

In brief, the indicator cell array 320 may include a first cell group having memory cells on which a first verifying operation is performed, a second cell group having memory cells on which a second verifying operation is performed, a third cell group having memory cells on which a third verifying operation is performed, a fourth cell group having memory cells on which a fourth verifying operation is performed, and so on.

The indicator cell page buffer 322 includes a first page buffer 612 for storing temporarily data to be input to the first cell 610, a second page buffer 622 for storing temporarily data to be input to the second cell 620, a third page buffer 632 for storing temporarily data to be input to the third cell 630 and a fourth page buffer 642 for storing temporarily data to be input to the fourth cell 640.

Accordingly, first data are stored in the first page buffer 612, wherein a threshold voltage of a corresponding indicator cell in FIG. 2A has a voltage higher than the first verifying voltage PV(i) and smaller than the second verifying voltage PV(i+1) in accordance with the first data. Second data are stored in the second page buffer 622, wherein a threshold voltage of a corresponding indicator cell has a voltage higher than the second verifying voltage PV(i+1) and smaller than the third verifying voltage PV(i+2) in accordance with the second data. Third data are stored in the third page buffer 632, wherein a threshold voltage of a corresponding indicator cell has a voltage higher than the third verifying voltage PV(i+2) and smaller than the fourth verifying voltage PV(i+3) in accordance with the third data. Fourth data are stored in the fourth page buffer 642, wherein a threshold voltage of a corresponding indicator cell has a voltage higher than the fourth verifying voltage PV(i+3) in accordance with the fourth data. Furthermore, each of the page buffers outputs the verifying finish signal when a corresponding memory cell is programmed to a voltage that is more than the corresponding verifying voltage.

When one group has memory cells, the indicator cell page buffer 322 includes a plurality of page buffer groups. For example, the indicator cell page buffer 322 has a first page buffer group coupled to the first cell group, a second page buffer group coupled to the second cell group, a third page buffer group coupled to the third cell group, a fourth page buffer group coupled to the fourth cell group, and so on.

FIG. 6 shows the indicator cell array 320 and the indicator cell page buffer 322 in a method of programming the MLC for storing 3 bits. A verifying operation may be performed with a new indicator cell array in a method of programming an MLC for storing 2 bits, wherein number of cells in the new indicator cell is smaller than that of the cells 610, 620, 630 and 640 in the indicator cell 320. It is desirable that $2^{n-1}$ cells and $2^{n-1}$ page buffers are used when an MLC for storing n bits is programmed.

In another example embodiment of the present invention, the indicator cell array 320 may not have the fourth cell 640 corresponding to the fourth verifying operation. This is because it is not determined whether the verifying operation related to the fourth cell is finished since the fourth verifying operation is performed last, i.e. a fifth verifying operation following the fourth verifying operation is not performed.

Figure 7:
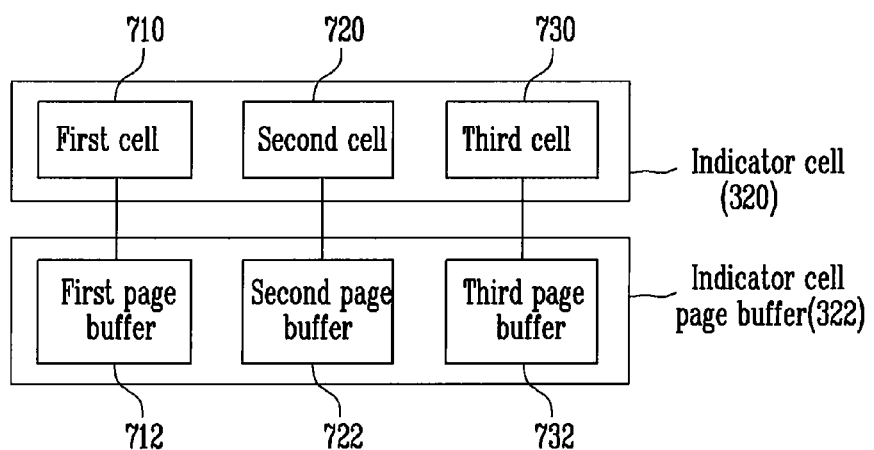
FIG. 7 is a block diagram illustrating an indicator cell array and an indicator cell page buffer according to another example embodiment of the present invention.

FIG. 7 is a block diagram illustrating an indicator cell array and an indicator cell page buffer according to another example embodiment of the present invention.

In FIG. 7, the indicator cell array 320 includes a first cell 710 on which a first verifying operation is performed based on a first verifying voltage PV(i), a second cell 720 on which a second verifying operation is performed based on a second verifying voltage PV(i+1), and a third cell 730 on which a third verifying operation is performed based on a third verifying voltage PV(i+2).

The indicator cell page buffer 322 has a first page buffer 712 for storing temporarily data to be input to the first cell 710, a second page buffer 722 for storing temporarily data to be input to the second cell 720, and a third page buffer 732 for storing temporarily data to be input to the third cell 730. Accordingly, first data are stored in the first page buffer 712, wherein a threshold voltage of a corresponding indicator cell in FIG. 2A has a voltage higher than the first verifying voltage PV(i) and smaller than the second verifying voltage PV(i+1) in accordance with the first data. Second data are stored in the second page buffer 722, wherein a threshold voltage of a corresponding indicator cell has a voltage higher than the second verifying voltage PV(i+1) and smaller than the third verifying voltage PV(i+2) in accordance with the second data. Third data are stored in the third page buffer 732, wherein a threshold voltage of a corresponding indicator cell has a voltage higher than the third verifying voltage PV(i+2) and smaller than a fourth verifying voltage PV(i+3) in accordance with the third data.

In addition, when a cell and a page buffer related to a final verifying operation are not needed as mentioned above, $2^{(n-1)}-1$ cells and $2^{(n-1)}-1$ page buffers are required when an MLC for storing n bits is programmed.

Referring to FIG. 5, the data in each of the page buffers are provided to the bit line and then a program operation is performed in step 530. The data in each of the page buffers of the indicator cell page buffer are transmitted to the bit line and the program operation is performed. Since the main cell and the indicator cell are coupled to the same word line, a same program voltage is applied to the word line.

The data in the page buffer are provided to the bit line as mentioned above, and a voltage level of the bit line has a high level or a low level in accordance with the provided data.

The program voltage is applied to a corresponding word line coupled vertically to the bit line. The program voltage is applied to a word line coupled to the memory cell to be programmed, and a pass voltage smaller than the program voltage is provided to the word lines except the word line coupled to the memory cell. Accordingly, when the program voltage is applied to the word line when the bit line related to a specific memory cell has a low level, the specific memory cell is programmed. Additionally, memory cells except the specific memory cell are maintained at an erase state.

The program voltage is repeatedly applied to the corresponding word line and is increased by a given level for each application in accordance with an incremental step pulse programming ISPP method.

Hereinafter, the verifying operation will be described in detail.

In step 540, a first verifying operation is performed based on the first verifying voltage PV(i). The first verifying operation determines whether or not the threshold voltage of the first cell 610 is higher than the first verifying voltage PV(i). Particularly, the first verifying voltage PV(i) is applied to a corresponding word line when the bit line coupled to the memory cell to be verified is precharged to a high level, and a pass voltage is provided to the word lines except the word line to which the first verifying voltage PV(i) is applied.

The first verifying operation is performed on the indicator cell and the main cell included in the page buffer having the indicator cell. That is, the first verifying operation is performed on the main cell based on the first verifying voltage PV(i).

When a corresponding memory cell is programmed, i.e. the threshold voltage of the memory cell is higher than the first verifying voltage PV(i), the memory cell is not turned on. As a result, a current path is not formed in a cell string having the memory cell, and the voltage level of the bit line is maintained at a high level.

However, when the memory cell is not programmed, i.e. the threshold voltage of the memory cell is smaller than the first verifying voltage PV(i), the memory cell is turned on. As a result, the current path is formed in the cell string having the memory cell, and the voltage level of the bit line is converted from a high level to a low level.

In brief, the voltage level of the bit line is changed depending on a program result of the memory cell, and data corresponding to the voltage of the bit line is provided to the sensing node SO and are stored in the register in a corresponding page buffer.

When the threshold voltage of the memory cell is increased to a voltage more than the first verifying voltage PV(i) in accordance with the first verifying operation, a second verifying operation following the first verifying operation is performed based on the second verifying voltage PV(i+1). However, when the threshold voltage of the memory cell is not increased to a voltage more than the first verifying voltage PV(i) in accordance with the first verifying operation, the program operation and the first verifying operation are performed again in steps 530 to 542.

When the threshold voltage of the first cell 610 is not increased to a voltage more than the first verifying voltage PV(i), the verifying finish signal MSBVER_N having a high level is output from the first page buffer 612 and is transmitted to the control logic circuit 330. The control logic circuit 330 controls the high voltage generator 340 so that the first verifying voltage PV(i) is continuously applied to the word line.

However, when the threshold voltage of the first cell 610 is increased to a voltage more than the first verifying voltage PV(i), the verifying finish signal MSBVER_N having a floating state is output from the first page buffer 612 and is input to the control logic circuit 330. The control logic circuit 330 controls the high voltage generator 340 so that the second verifying voltage PV(i+1) is applied to the word line. In other words, the second verifying operation is performed based on the second verifying voltage PV(i+1).

In brief, the second verifying operation is performed based on the second verifying voltage PV(i+1) after it is verified that the first cell 610 as an indicator cell is programmed to a voltage more than the first verifying voltage PV(i).

In step 550, the second verifying operation is performed based on the second verifying voltage PV(i+1). The second verifying operation determines whether the threshold voltage of the second cell 620 is higher than the second verifying voltage PV(i+1). Particularly, the second verifying voltage PV(i+1) is applied to a corresponding word line when the bit line coupled to the memory cell to be verified is precharged to a high level, and a pass voltage is provided to the word lines except the corresponding word line to which the second verifying voltage PV(i+1) is applied.

The second verifying operation is performed on the indicator cell and the main cell included in the page buffer having the indicator cell. That is, the second verifying operation is performed on the main cell based on the second verifying voltage PV(i+1).

When a corresponding memory cell is programmed, i.e. the threshold voltage of the memory cell is higher than the second verifying voltage PV(i+1), the memory cell is not turned on. As a result, a current path is not formed in a cell string having the memory cell, and the voltage level of the bit line is maintained at a high level.

However, when the memory cell is not programmed, i.e. the threshold voltage of the memory cell is smaller than the second verifying voltage PV(i+1), the memory cell is turned on. As a result, the current path is formed in the cell string having the memory cell, and the voltage level of the bit line is converted from a high level to a low level.

In brief, the voltage level of the bit line is changed depending on a program result of the memory cell, and data corresponding to the voltage of the bit line is provided to the sensing node SO and is stored in the register in a corresponding page buffer.

When the threshold voltage of the memory cell is increased to a voltage more than the second verifying voltage PV(i+1) in accordance with the second verifying operation, a third verifying operation following the second verifying operation is performed based on the third verifying voltage PV(i+2). However, when the threshold voltage of the memory cell is not increased to a voltage more than the second verifying voltage PV(i+1) in accordance with the second verifying operation, the program operation, the first verifying operation and the second verifying operation are performed again in steps 530 to 552.

When the threshold voltage of the second cell 620 is not increased to a voltage more than the second verifying voltage PV(i+1), the verifying finish signal MSBVER_N having a high level is output from the second page buffer 622 and is transmitted to the control logic circuit 330. The control logic circuit 330 controls the high voltage generator 340 so that the second verifying voltage PV(i+1) is continuously applied to the word line.

However, when the threshold voltage of the second cell 620 is increased to a voltage more than the second verifying voltage PV(i+1), the verifying finish signal MSBVER_N having a floating state is output from the second page buffer 622 and is input to the control logic circuit 330. The control logic circuit 330 controls the high voltage generator 340 so that the third verifying voltage PV(i+2) is applied to the word line. In other words, the third verifying operation is performed based on the third verifying voltage PV(i+2).

In step 560, the third verifying operation is performed based on the third verifying voltage PV(i+2). The third verifying operation determines whether the threshold voltage of the third cell 630 is higher than the third verifying voltage PV(i+2). Particularly, the third verifying voltage PV(i+2) is applied to a corresponding word line when the bit line coupled to the memory cell to be verified is precharged to a high level, and a pass voltage is provided to the word lines except the corresponding word line to which the third verifying voltage PV(i+2) is applied.

The third verifying operation is performed on the indicator cell and the main cell included in the page buffer having the indicator cell. That is, the third verifying operation is performed on the main cell based on the third verifying voltage PV(i+2).

When a corresponding memory cell is programmed, i.e. the threshold voltage of the memory cell is higher than the third verifying voltage PV(i+2), the memory cell is not turned on. As a result, a current path is not formed in a cell string having the memory cell, and the voltage level of the bit line is maintained at a high level.

However, when the memory cell is not programmed, i.e. the threshold voltage of the memory cell is smaller than the third verifying voltage PV(i+2), the memory cell is turned on. As a result, the current path is formed in the cell string having the memory cell, and the voltage level of the bit line is converted from a high level to a low level.

In brief, the voltage level of the bit line is changed depending on a program result of the memory cell, and data corresponding to the voltage of the bit line is provided to the sensing node SO and is stored in the register in a corresponding page buffer.

When the threshold voltage of the memory cell is increased to a voltage more than the third verifying voltage PV(i+2) in accordance with the third verifying operation, a fourth verifying operation following the third verifying operation is performed based on the fourth verifying voltage PV(i+3). However, when the threshold voltage of the memory cell is not increased to a voltage more than the third verifying voltage PV(i+2) in accordance with the third verifying operation, the program operation, the first verifying operation, the second verifying operation and the third verifying operation are performed again in steps 530 to 562.

When the threshold voltage of the third cell 630 is not increased to a voltage more than the third verifying voltage PV(i+2), the verifying finish signal MSBVER_N having a high level is output from the third page buffer 632 and is transmitted to the control logic circuit 330. The control logic circuit 330 controls the high voltage generator 340 so that the third verifying voltage PV(i+2) is continuously applied to the word line.

However, when the threshold voltage of the third cell 630 is increased to a voltage more than the third verifying voltage PV(i+2), the verifying finish signal MSBVER_N having a floating state is output from the third page buffer 632 and is input to the control logic circuit 330. The control logic circuit 330 controls the high voltage generator 340 so that the fourth verifying voltage PV(i+3) is applied to the word line. In other words, the fourth verifying operation is performed based on the fourth verifying voltage PV(i+3).

In step 570, the fourth verifying operation is performed based on the fourth verifying voltage PV(i+3). The fourth verifying operation determines whether the threshold voltage of the fourth cell 640 is higher than the fourth verifying voltage PV(i+3). Particularly, the fourth verifying voltage PV(i+3) is applied to a corresponding word line when the bit line coupled to the memory cell to be verified is precharged to a high level, and a pass voltage is provided to word lines except the corresponding word line to which the fourth verifying voltage PV(i+3) is applied.

The third verifying operation is performed on the indicator cell and the main cell included in the page buffer having the indicator cell. That is, the fourth verifying operation is performed on the main cell based on the fourth verifying voltage PV(i+3).

When a corresponding memory cell is programmed, i.e. the threshold voltage of the memory cell is higher than the fourth verifying voltage PV(i+3), the memory cell is not turned on. As a result, a current path is not formed in a cell string having the memory cell, and the voltage level of the bit line is maintained at a high level.

However, when the memory cell is not programmed, i.e. the threshold voltage of the memory cell is smaller than the fourth verifying voltage PV(i+3), the memory cell is turned on. As a result, the current path is formed in the cell string having the memory cell, and the voltage level of the bit line is converted from a high level to a low level.

In brief, the voltage level of the bit line is changed depending on a program result of the memory cell, and data corresponding to the voltage of the bit line is provided to the sensing node SO and stored in the register in a corresponding page buffer.

When the threshold voltage of the memory cell is increased to a voltage more than the fourth verifying voltage PV(i+3) in accordance with the fourth verifying operation, the above program operation is finished. However, when the threshold voltage of the memory cell is not increased to a voltage more than the fourth verifying voltage PV(i+3) in accordance with the fourth verifying operation, the above program operation, the first verifying operation, the second verifying operation, the third verifying operation and the fourth verifying operation are performed again in steps 530 to 572.

When the threshold voltage of the fourth cell 640 is not increased to a voltage more than the fourth verifying voltage PV(i+3), the verifying finish signal MSBVER_N having a high level is output from the fourth page buffer 642 and is transmitted to the control logic circuit 330. The control logic circuit 330 controls the high voltage generator 340 so that the fourth verifying voltage PV(i+3) is applied to the word line.

However, when the threshold voltage of the fourth cell 640 is increased to a voltage more than the fourth verifying voltage PV(i+3), the verifying finish signal MSBVER_N having a floating state is output from the fourth page buffer 642 and is input to the control logic circuit 330. The control logic circuit 330 controls the high voltage generator 340 so that the program voltage is not applied to the word line.

When an indicator cell and an indicator cell page buffer related to a final verifying operation are not needed as shown in the embodiment in FIG. 7, the fourth verifying operation may not be performed. The fourth verifying operation is not performed on the indicator cell, but is performed on the main cell.

As described above, the verifying operation is performed based on the threshold voltage of the indicator cell. When the indicator cell is programmed to a voltage more than a specific verifying voltage, a new verifying operation is performed based on a new verifying voltage higher than the specific verifying voltage.

Hereinafter, waveforms of the program voltage and the verifying voltage of the present invention will be described in detail.

Figure 8A:
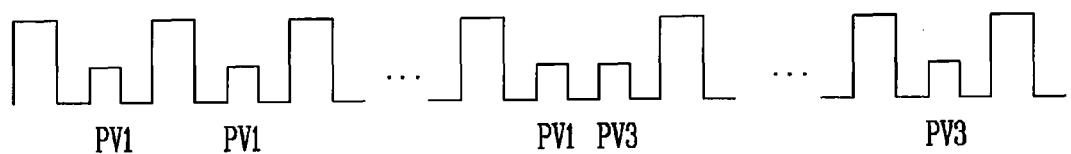
FIG. 8A is a view illustrating a waveform of the program voltage and the verifying voltage applied when the MLC for storing 2 bits is programmed.
Figure 8B:
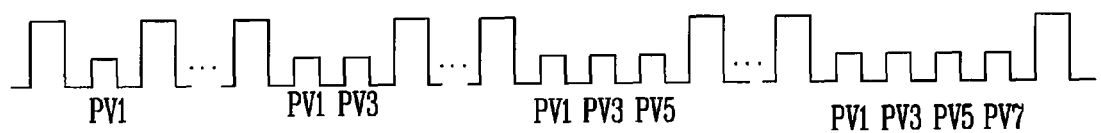
FIG. 8B is a view illustrating a waveform of the program is voltage and the verifying voltage applied when the MLC for storing 3 bits is programmed.
Figure 8C:
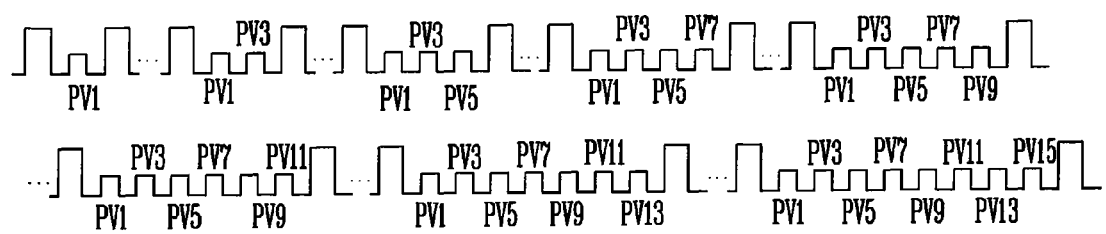
FIG. 8C is a view illustrating a waveform of the program voltage and the verifying voltage applied when the MLC for storing 4 bits is programmed.

FIG. 8A is a view illustrating a waveform of the program voltage and the verifying voltage applied when the MLC for storing 2 bits is programmed. FIG. 8B is a view illustrating a waveform of the program voltage and the verifying voltage applied when the MLC for storing 3 bits is programmed. FIG. 8C is a view illustrating a waveform of the program voltage and the verifying voltage applied when the MLC for storing 4 bits is programmed.

In FIG. 8A, a verifying operation is performed based on a first verifying voltage PV1 and a second verifying voltage PV3 when the MLC for storing 2 bits is programmed. The verifying operation is performed based on the second verifying voltage PV3 only when the indicator cell is programmed to a voltage more than the first verifying voltage PV1. In addition, when the verifying operation using the first verifying voltage PV1 is finished while the verifying operation using the first verifying voltage PV1 and the verifying operation using the second verifying voltage PV3 are performed, only the verifying operation using the second verifying voltage PV3 is performed.

In FIG. 8B, a verifying operation is performed based on a first verifying voltage PV1, a second verifying voltage PV3, a third verifying voltage PV5 and a fourth verifying voltage PV7 when the MLC for storing 3 bits is programmed. The verifying operation is performed based on the second verifying voltage PV3 only when the indicator cell is programmed to a voltage more than the first verifying voltage PV1. Additionally, when the indicator cell is programmed to a voltage more than the second verifying voltage PV3, the verifying operation is performed based on the third verifying voltage PV5. Furthermore, when the indicator cell is programmed to a voltage more than the third verifying voltage PV5, the verifying operation is performed based on the fourth verifying voltage PV7.

In FIG. 8C, a verifying operation is performed based on a first verifying voltage PV1, a second verifying voltage PV3, a third verifying voltage PV5, a fourth verifying voltage PV7, a fifth verifying voltage PV9, a sixth verifying voltage PV11, a seventh verifying voltage PV13 and an eighth verifying voltage PV15 when the MLC for storing 4 bits is programmed. The verifying operation is performed based on the second verifying voltage PV3 only when the indicator cell is programmed to a voltage more than the first verifying voltage PV1. When the indicator cell is programmed to a voltage more than the second verifying voltage PV3, the verifying operation is performed based on the third verifying voltage PV5. When the indicator cell is programmed to a voltage more than the third verifying voltage PV5, the verifying operation is performed based on the fourth verifying voltage PV7. When the indicator cell is programmed to a voltage more than the fourth verifying voltage PV9, the verifying operation is performed based on the fifth verifying voltage PV11. When the indicator cell is programmed to a voltage more than the fifth verifying voltage PV11, the verifying operation is performed based on the sixth verifying voltage PV13. When the indicator cell is programmed to a voltage more than the sixth verifying voltage PV13, the verifying voltage is performed based on the eighth verifying voltage PV15.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification do not necessarily refer to the same embodiment. Further, when a particular feature, structure, or characteristic is described in connection with any embodiment, it is within the purview of one skilled in the art to affect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A non-volatile memory device comprising:
a plurality of indicator cells, wherein each indicator cell is verified when a main cell is verified;
an indicator cell page buffer configured to output a verifying finish signal in accordance with a program result of the indicator cell; and
a control logic circuit configured to change a verifying voltage by controlling a high voltage generator in accordance with the output verifying finish signal.

2. The non-volatile memory device of claim 1, wherein the indicator cell has at least $2^{(n-1)}-1$ cells when a multi level cell for storing n bits is programmed.

3. The non-volatile memory cell of claim 1, wherein the indicator cell includes a first cell for storing data when a multi level cell for storing 2 bits is programmed,
and wherein data are provided to the first cell so that a threshold voltage of the first cell is higher than a first verifying voltage and is smaller than a second verifying voltage.

4. The non-volatile memory device of claim 1, wherein the indicator cell has a first cell for storing first data, a second cell for storing second data and a third cell for storing third data when a multi level cell for storing 3 bits is programmed,
and wherein the first data are provided to the first cell so that a threshold voltage of the first cell is higher than a first verifying voltage and is smaller than a second verifying voltage, the second data are provided to the second cell so that a threshold voltage of the second cell is higher than the second verifying voltage and is smaller than a third verifying voltage, and the third data are provided to the third cell so that a threshold voltage of the third cell is higher than the third verifying voltage and is smaller than a fourth verifying voltage.

5. The non-volatile memory cell of claim 1, wherein the indicator cell includes a first cell group having cells when a multi level cell for storing 2 bits is programmed, and wherein data are provided to the first cell group so that a threshold voltage of the first cell group is higher than a first verifying voltage and is smaller than a second verifying voltage.

6. The non-volatile memory device of claim 1, wherein the indicator cell includes a first cell group having first cells, a second cell group having second cells and a third cell group having third cells when a multi level cell for storing 3 bits is programmed, and wherein first data are provided to the first cell group so that a threshold voltage of the first cell group is higher than a first verifying voltage and is smaller than a second verifying voltage, second data are provided to the second cell group so that a threshold voltage of the second cell group is higher than the second verifying voltage and is smaller than a third verifying voltage, and third data are provided to the third cell group so that a threshold voltage of the third cell group is higher than the third verifying voltage and is smaller than a fourth verifying voltage.

7. The non-volatile memory device of claim 3, further comprising:

a first cell page buffer configured to output a first verifying finish signal in accordance with a program result of the first cell.

8. The non-volatile memory device of claim 7, wherein the control logic circuit controls the high voltage generator so that a (n+1)th verifying voltage is applied when a nth verifying finish signal is output.

9. The non-volatile memory device of claim 4, further comprising:

a first cell page buffer configured to output a first verifying finish signal in accordance with a program result of the first cell;

a second cell page buffer configured to output a second verifying finish signal in accordance with a program result of the second cell; and a third cell page buffer configured to output a third verifying finish signal in accordance with a program result of the third cell.

10. The non-volatile memory device of claim 9, wherein the control logic circuit controls the high voltage generator so that a (n+1)th verifying voltage is applied when a nth verifying finish signal is outputted.

11. The non-volatile memory device of claim 5, further comprising:

a first cell page buffer group configured to output a first verifying finish signal in accordance with a program result of the first cell group.

12. The non-volatile memory device of claim 11, wherein the control logic circuit controls the high voltage generator so that a (n+1)th verifying voltage is applied when at least one nth verifying finish signal is output.

13. The non-volatile memory device of claim 11, wherein the control logic circuit controls the high voltage generator so that a (n+1)th verifying voltage is applied when a preset number of nth verifying finish signal is output.

14. The non-volatile memory device of claim 6, further comprising:

a first cell page buffer group configured to output a first verifying finish signal in accordance with a program result of the first cell group;

a second cell page buffer group configured to output a second verifying finish signal in accordance with a program result of the second cell group; and a third cell page buffer group configured to output a third verifying finish signal in accordance with a program result of the third cell group.

15. The non-volatile memory device of claim 14, wherein the control logic circuit controls the high voltage generator so that a (n+1)th verifying voltage is applied when at least one nth verifying finish signal is output.

16. The non-volatile memory device of claim 14, wherein the control logic circuit controls the high voltage generator so that a (n+1)th verifying voltage is applied when a preset number of an nth verifying finish signal is output.

* * * * *